United States Patent [19]

Kienel et al.

[11] 4,115,653

[45] Sep. 19, 1978

[54] ELECTRON BEAM VAPORIZER

[75] Inventors: Gerhard Kienel, Hanau am Main; Helmut Petersein, Gelnhausen-Höchst, both of Germany

[73] Assignee: Leybold-Heraeus GmbH & Co. KG, Cologne, Germany

[21] Appl. No.: 729,575

[22] Filed: Oct. 4, 1976

[30] Foreign Application Priority Data

Oct. 7, 1975 [DE] Fed. Rep. of Germany ....... 2544725

[51] Int. Cl.$^2$ .......................................... H01J 37/305
[52] U.S. Cl. ........................................ 13/31; 118/49.1
[58] Field of Search ............... 13/31, 31 EB; 219/271; 118/49, 49.1

[56] References Cited

U.S. PATENT DOCUMENTS

| 2,745,773 | 5/1956 | Weimer | 118/49 X |
|---|---|---|---|
| 3,250,842 | 5/1966 | Hikido | 13/31 |

OTHER PUBLICATIONS

IBM Technical Disclosure Bulletin, "Removable Pocket Hearth Segment for an Electron Gun", Arfman et al, vol. 17, No. 12, May 1975.

Primary Examiner—R. N. Envall, Jr.
Attorney, Agent, or Firm—Burgess, Dinklage & Sprung

[57] ABSTRACT

Electron beam vaporizer having a beam generator with a heated cathode, focusing means and electromagnetic deflection means for the deflection and guidance of the beam. An exchangeable, fluid-cooled and preferably rotatable vaporizing crucible associated with the beam generator and having at least one depression in the base thereof for at least one substance to be vaporized. The crucible has passages for the flow of a coolant beneath the depression and the base of the vaporizing crucible is constructed as separate components having a common contact surface so that a removable crucible head is formed. The crucible base is closed off from its environment with regard to the flow passages.

5 Claims, 5 Drawing Figures

ELECTRON BEAM VAPORIZER

BACKGROUND

The invention relates to an electron beam vaporizer consisting of a beam generator with a heatable cathode, focusing means, and electromagnetic deflection means for the deflection and guidance of the beam, and a replaceable, liquid-cooled and preferably rotatable vaporizing crucible which is associated with the beam generator, has at least one cavity for at least one substance to be vaporized, and has passages in the base of the crucible underneath the said cavity or cavities to carry the circulating coolant.

In electron beam vaporizers it is often necessary to adapt the vaporizing crucible to a particular vaporizing task and in this case to replace it, even at short intervals of time; with vaporizing crucibles of different geometrical configuration, e.g., with a different arrangement of the cavities. Shallow vaporizing crucibles of great breadth are required, successively as a rule, for the accommodation of comparatively large amounts of material in powder form, in a single cavity of large area. For other purposes, such as the formation of alloy coatings and/or interference systems in the field of optics, crucibles are often required which have several cavities for the accommodation of different vaporizing materials. The cavities in this case can be truncoconical depressions in the crucible surface, which are distributed more or less uniformly over its circumference. The individual vaporizing substances are then brought into the path of the electron beam by periodical rotation of the vaporizing crucible and/or by changes in the deflection of the beam. It is also possible, for example, to provide the vaporizing crucibles with a plurality of concentric, annular grooves to receive different vaporizing substances, and to sweep these grooves alternately, for example, with a jumping electron beam, while at the same time a rotation of the vaporizing crucible is performed so as to bring always fresh material into the path of the beam. In the case of the vaporizing of a plurality of substances it will, of course, be necessary to assure that the vapor depositing system is not vented between the vaporizing of the individual components. As a rule, therefore, a plurality of crucible arrangements must be held ready for the electron beam vaporizer.

It can also come about that, due to errors of beam positioning and/or to thermal overstressing of the crucible—if the crucible should run out of the material being vaporized for example—the crucible may become damaged and have to be replaced.

For the purpose outlined above, it is known to mount the vaporizing crucible with the cooling channels releasably on a base frame by means of a flange, with the interposition of a gasket, the base frame containing the cooling input and output lines (German "Offenlegungsschrift" No. 2,206,995, p. 10, last paragraph, and p. 11, par. 1). The design of the crucible in this case, however, is complex, since each crucible must be equipped with complete cooling passages, and also it necessitates, in the case of rotatable crucibles, a vacuum-tight seal between the rotatable part and the stationary part. This complex construction must be provided in each and every one of the interchangeable crucibles. Such a crucible is furthermore hard to clean, and this is very important in view of the high purity which is usually required in coatings deposited from vapors. Also, the set-up work that has to be done when the crucible is replaced is difficult, and the entire electron beam vaporizer has to be disassembled for this purpose, since in this case the system of coolant passages is opened up. Disassembly within the vacuum chamber is difficult, complicated and time-consuming, and while the vacuum is applied it is, of course, utterly impossible.

It is also known to replace only the rotatable part of the crucible, disconnecting it from the stationary part. In this system, too, the coolant passage network is opened up; also, such a crucible is of complex shape, so that here again the replacement of the crucible can be accomplished only through the complete disassembly of the electron beam vaporizer.

THE INVENTION

The invention, therefore, is addressed to the problem of improving an electron beam vaporizer of the kind initially described, such that crucible exchange will be possible without disassembly or partial disassembly of the electron beam vaporizer, and without any opening of the coolant passages.

The solution of this problem is accomplished in accordance with the present invention, in the electron beam vaporizer described in the beginning, in that the vaporizing crucible and the crucible base are constructed as separate components and have a common contact surface, so that a removable crucible head is formed, and in that the crucible base is sealed off from its surroundings as far as the circulation passages are concerned.

In the application of the teaching of the invention, the vaporizing crucible or crucible head, as the case may be, has an extremely simple form requiring relatively few fabricating operations, such as for example the form of a circular, flat disk with appropriate cavities in accordance with the explanations given in the introduction. Such a crucible head can either be placed just loosely on the crucible base, or it can be joined to the latter by easily releasable fastening means such as detents, locating pins, etc. To accomplish change-overs, it is necessary only to replace the crucible head with another. It is also possible to compress powdered or granular vaporizing material into this crucible head under high pressure, in order thus to achieve a uniform density and hence a uniform rate of vaporization. Compression of powders under high pressure is not possible in the known vaporizing crucibles, because the structure of the latter is weakened by the cooling passages so that they would be damaged by the pressure. Furthermore, on account of its ease of removal, the crucible head can be cleaned thoroughly and reliably with the use of mechanical cleaning means (sand blasting, turning in a lathe, etc.). In the case of costly crucible material it is even possible to rebuild the crucibles by turning in a lathe to remove damaged portions of their surface. In addition, due to the relatively small amount of material used in them and to their low manufacturing cost, these crucible heads can also be "throw-away crucibles" which are supplied to the user already packed with vaporizing material to his precise specifications.

Above all, however, in the electron beam vaporizer of the invention, the crucible head can be replaced without disassembling the electron beam vaporizer and without opening the cooling passages, and in fact even without relieving the vacuum. It is possible, for example, to have a supply of several different kinds of crucible heads stacked in magazines within a vapor depositing apparatus, so that, by means of a manipulator or some other transport device, they can be placed successively on the crucible base while the vacuum is maintained. Even if the vacuum is relieved, however, the opening time will be shorter, as will the evacuation time and the loading time.

The invention is based on the surprising discovery that the direct application of coolant to the crucible material in the area of the cavities is not necessary, and that, instead, an interface between the crucible base and the thermally stressed crucible head provides for an entirely adequate transfer of heat from one to the other. Not even precision machining of the contact surfaces is necessary. This finding is in contrast to the previous teaching that the passages for the coolant must be located in the immediate vicinity of the heated material.

An especially advantageous embodiment of the invention is characterized, in accordance with the further invention, in that the crucible base has a vertical pipe provided with a flange for fastening to a base frame, and, mounted on the vertical pipe, a table provided with cavities, which is rotatable with respect to the pipe and is sealed by means of a rotary seal. The vertical pipe can, in an especially advantageous manner, be completed by a concentric conduit for the coolant.

DESCRIPTION OF THE DRAWING

An embodiment of the invention will be explained with the aid of FIGS. 1 and 5.

DESCRIPTION

Figure 1:
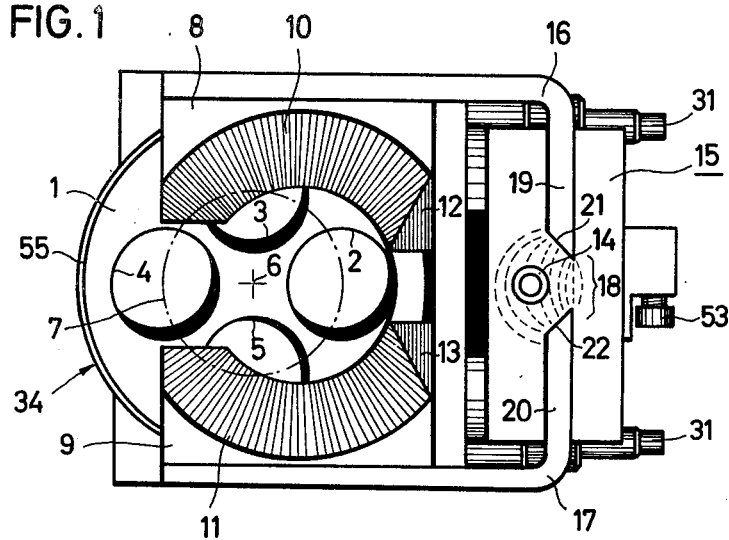
FIG. 1 is a top plan view of a complete electron beam vaporizer having a crucible head with four cavities.

In FIG. 1, 1 is a vaporizing crucible which is constructed as a crucible head and consists of a solid copper disk in which four cavities 2 to 5 are provided for receiving the substance to be vaporized. The center axes of the cavities are disposed on a circle 7 concentric with the axis of rotation of the crucible. For the focusing and deflection of the electron beam there is provided a pair of block-type pole shoes 8 and 9 provided with arcuate bevels 10 and 11, respectively. The angle of the bevels is such that the rising stream of vapor is not interfered with and does not condense on the surfaces of the pole shoes. The pole shoes 8 and 9 each have additional chambers 12 and 13, respectively, which together form an approximately V-shaped channel. The pole shoes 8 and 9 with the chamfers 12 and 13 together form a main pole shoe system by which the electron beam is turned about by 180° and is guided on an arcuate path and deflected onto the material to be vaporized. As shown in FIG. 1, the cavity 2 assumes such a position that it or its contents form the target of an electron beam emerging from an aperture 14. The electron beam is formed in the interior of a beam generator 15. The axis of symmetry of a cathode situated centrally within the aperture 14 is parallel to the observer's line of sight.

Bent armatures 16 and 17 disposed in mirror-image relationship to one another are magnetically associated with the pole shoes 8 and 9 and constitute a secondary pole shoe system 18 whose two pole shoes 19 and 20 are located in back of the axis of symmetry of the cathode and aperture 14, as seen from the target or cavity 2. The confronting ends of pole shoes 19 and 20 are provided with the surfaces 21 and 22 which form an angle opening towards the aperture 14. This angle amounts in the present case to 90°.

Figure 2:
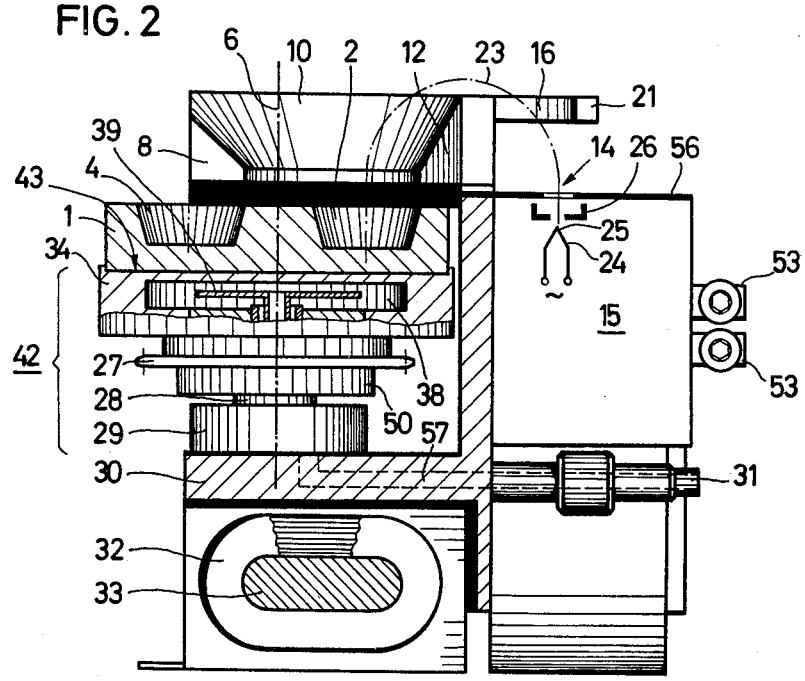
FIG. 2 is a cross-sectional view taken along the plane of symmetry of FIG. 1.

In FIG. 2, parts identical to those in FIG. 1 are provided with the same reference numbers. The beam generator 15 contains an electrically heated cathode 24 (here represented symbolically) whose emission surface 25 is surrounded by a focusing electrode 26 in the form of a Wehnelt cylinder. The axis of symmetry of this system coincides with the initial portion of the axis of the beam 23. The chamber wall 56, which is at ground potential, is simultaneously an accelerating anode, and contains the aperture 14 through which the electron beam emerges.

The vaporizing crucible lies on a table 34 provided with a cavity 38 and is rotatable therewith about the axis of rotation 6, the various crucible cavities 3 to 5 being thus brought successively to the same position as crucible cavity 2. The rotary motion is brought about by means of a sprocket wheel 27 in conjunction with a second sprocket wheel, which is not shown, and a chain. The table 34 is of hollow construction and is placed on a tube 28 with the interposition of a two-piece shaft seal 41, the tube serving also for the feeding and return of coolant. The pipe has a flange 29 which is fastened onto a base frame 30. The latter is provided with a network of cooling passages 57, represented by broken lines, which provide the connection between the cavity 38 in the table 34 and the coolant supply and return lines 31. The intensive cooling of the base frame simultaneously serves as an effective heat shield for the magnet coil 32 beneath it. This magent coil is wound about the yoke 33 of the main pole shoe system 8–9. The arm of the yoke that is nearest the observer has been omitted to reveal the interior of the apparatus, and the one farthest from the observer is concealed virtually entirely by the crucible 1 and table 34. Terminals 53 serve for the supply of power to the beam generator 15.

The table 34, together with the tube 28 and flange 29, as well as the additional components contained in it, forms the crucible base 42, i.e., the support for the actual vaporizing crucible 1. It can be seen that the vaporizing crucible 1 and the crucible base 42 are separate components contacting one another at a common, substantially horizontal and flat contact surface 43. A removable crucible head is thus formed, which brings with it the advantages described above. It can furthermore be seen that the crucible base is sealed off from its environment with regard to the coolant passages contained in it, even when the vaporizing crucible 1 is removed from the table 34. The term "environment" in this case refers to the operating vacuum prevailing within a vacuum vapor-depositing apparatus. From this it is apparent that the fact that the crucible base 42 is sealed against the vacuum entails special advantages.

Figure 5:
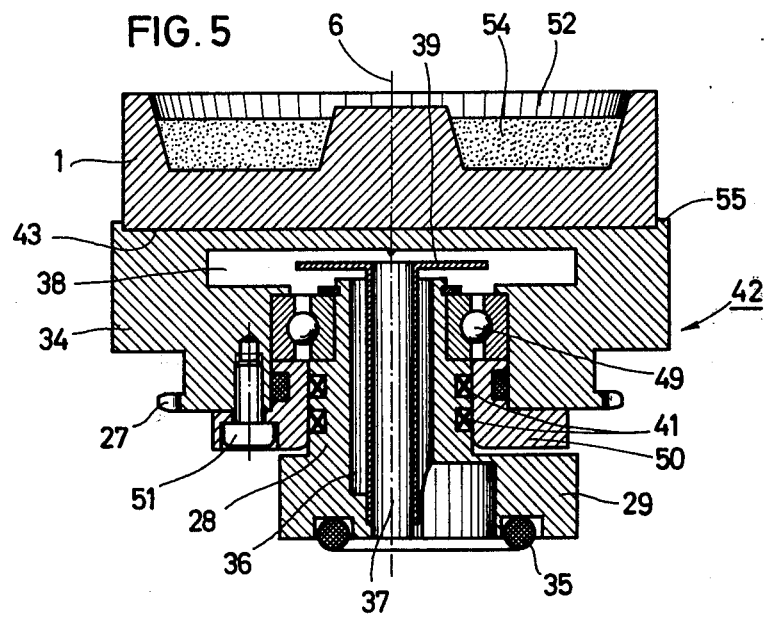
FIG. 5 is a vertical cross-sectional view taken through a crucible head having an annular groove into which powdered vaporizing material is compressed.

Additional details are illustrated in FIG. 5.

Figure 3:
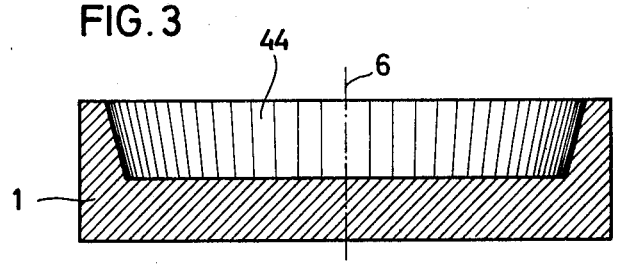
FIG. 3 is a cross-sectional view taken through a crucible head having only one cavity of large area.
Figure 4:
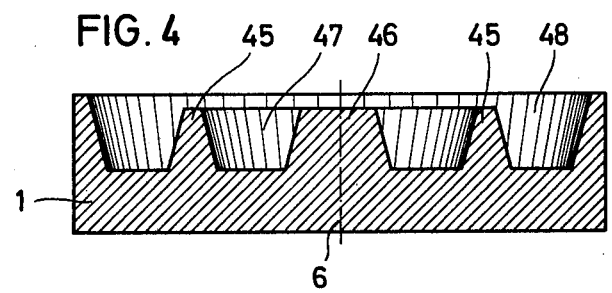
FIG. 4 is a cross-sectional view similar to FIG. 3, taken through a crucible head having two concentric annular grooves.

FIG. 3 shows a vaporizing crucible 1 having a cavity 44 of truncoconical shape, which extends over virtually the entire cross section of the crucible 1. In FIG. 4 there is illustrated a vaporizing crucible 1 in which two concentric annular grooves 47 and 48 are formed, which are centered about a flat-topped superelevated portion 46 and are separated by an annular wall 45 of trapezoidal cross section, and into which various kinds of material can be placed for vaporization.

FIG. 5 shows on a larger scale a vertical cross-section through the crucible base 42 of FIG. 2. The same reference numbers are used. It can be seen that the table 34 is joined in a rotatable manner, but also in a fluid-tight manner, with the interposition of a ball bearing 49 and a two-piece shaft seal 41, to the tube 28 which is to be mounted fixedly. The table 34 has for this purpose a fastening ring 50 which can be tightened axially against the table by bolts 51, thereby pressing the ball bearing 49 against a bead which has not been given a reference number. The fastening ring 15 with its internal cylindrical surface forms at the same time the contact surface for a rotary shaft seal 41 which is placed in grooves in the tube 28. Within the tube 28 there is a central passage 37 through which the coolant is carried into the cavity 38. A spreader means 39 assures a uniform sweeping of the cavity 38, which is in the form of a shallow circular chamber extending radially within the table 34 over a considerable distance. A gasket 35 assures a vacuum-tight and liquid-tight connection with the base frame 30 not represented in FIG. 5 (see FIG. 2 for this purpose). In the present case, a vaporizing crucible 1 is placed on the table 34 and has a single annular groove 52 concentric with the axis of rotation 6, into which groove powdered vaporizing material 54 has been compressed. In order to assure an absolutely coaxial position of the vaporizing crucible 1 with respect to the axis of rotation 6 of the table 34, the latter is provided with a circumferential raised rim 55. Additionally, a locating pin, which is not shown, can be provided, in order to prevent any unwanted rotation between the vaporizing crucible 1 and table 34. This is necessary, for example, if a vaporizing crucible in accordance with FIG. 1 must be brought into various definite positions in relation to the electron beam. The coolant is returned through an annular passage 36 within the tube 28, concentric with the central feed tube 37.

The different crucible forms represented in FIGS. 3, 4 and 5 can all be used in place of the crucible 1 of FIGS. 1 and 2. By means of different degrees of deflection of the beam 23 based on stronger or weaker excitation of the magnet coil 32, the focal spot of the electron beam 23 can be moved radially with respect to the vaporizing crucible 1. In this manner it is possible to sweep, for example, the entire inner surface of the vaporizing crucible of FIG. 3, or to sweep in an alternating manner the annular grooves 47 and 48 of a vaporizing crucible 1 in accordance with FIG. 4.

What is claimed is:

1. Electron beam varporizer comprising beam generating means with heated cathode means, focusing means and electromagnetic deflection means for the deflection and guidance of the beam, exchangeable, fluid-cooled vaporizing crucible means associated with the beam generating means and relatively movable with respect thereto and having at least one depression in the base thereof for at least one substance to be vaporized and passages for the flow of coolant beneath said depression, said vaporizing crucible means and the base thereof being constructed as separate components and having a common contact surface so that a removable crucible head is formed, said crucible base being closed off from its environment with regard to said flow passages.

2. Electron beam vaporizer of claim 1 wherein the crucible head is provided with a plurality of saucer-like depressions distributed about the circumference thereof.

3. Electron beam vaporizer of claim 1 wherein the crucible head is provided with a plurality of concentric annular grooves.

4. Electron beam vaporizer of claim 1 wherein the substance to be vaporized is compressed into the crucible head.

5. Electron beam vaporizer of claim 1 wherein the crucible base has a vertical tube with a flange for the fastening onto a base frame as well as a table placed on the tube and provided with cavities and is rotatable in respect to the tube and is sealed off by a rotary seal.

* * * * *